(12) United States Patent
Kim et al.

(10) Patent No.: US 6,700,315 B2
(45) Date of Patent: Mar. 2, 2004

(54) PLASMA DISPLAY DEVICE HAVING EFFICIENT HEAT CONDUCTIVITY

(75) Inventors: Ki-Jung Kim, Ahsan (KR); Guy-Sung Kim, Suwon (KR); Ki-Yun Joung, Cheonan (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/210,568

(22) Filed: Jul. 31, 2002

(65) Prior Publication Data

US 2003/0025428 A1 Feb. 6, 2003

(30) Foreign Application Priority Data

Aug. 3, 2001 (KR) ......................... 2001-47072
Oct. 15, 2001 (KR) ......................... 2001-63455

(51) Int. Cl.[7] ................................. H01J 1/02
(52) U.S. Cl. ................... 313/46; 362/294; 362/348
(58) Field of Search .................. 313/46, 45; 362/291, 362/294, 348; 361/681, 688; 315/169.4

(56) References Cited

U.S. PATENT DOCUMENTS 5,971,566 A * 10/1999 Tani et al. ................. 362/294
6,407,508 B1 * 6/2002 Kawada et al. .......... 315/169.3
6,477,039 B2 * 11/2002 Tajima ....................... 361/681

FOREIGN PATENT DOCUMENTS

JP 10-254372 9/1998
KR 2000-0074192 12/2000

* cited by examiner

Primary Examiner—Haissa Philogene
(74) Attorney, Agent, or Firm—Christie, Parker & Hale, LLP (57) ABSTRACT

A plasma display device including a plasma display panel, a chassis base proceeding substantially parallel to the plasma display panel, and a heat conductive medium closely adhered to the plasma display panel and the chassis base while being disposed between the plasma display panel and the chassis base. The side of the heat conductive medium facing the plasma display panel and/or chassis base is provided with a plurality of prominent portions. Depressed portions are disposed between the prominent portions to remove the gap between the heat conductive medium and the respective plasma display panel and/or chassis base. Contact area enlargement members are formed at the prominent portions to improve the attachment efficiency of the heat conductive medium to the respective plasma display panel and/or chassis base.

26 Claims, 12 Drawing Sheets

PLASMA DISPLAY DEVICE HAVING EFFICIENT HEAT CONDUCTIVITY

CROSS-REFERENCE TO RELATED APPLICATIONS

This application claims priority to and the benefit of Korean Application No. 2001-47072, filed on Aug. 3, 2001 and No. 2001-63455, filed on Oct. 15, 2001 in the Korean Patent Office, the entire disclosures of which are incorporated herein by reference.

FIELD OF THE INVENTION

The present invention relates to a plasma display device and, more particularly, to a plasma display device that has a heat conductive unit for dissipating the heat generated at the plasma display panel to the outside.

BACKGROUND OF THE INVENTION

Generally, a plasma display device involves a plasma display panel (PDP) where heat is generated due to the discharge gas. The heat generated at the PDP becomes heightened with the increase in brightness. Therefore, it is a critical factor in the plasma display device to dissipate to the outside in an effective manner the heat generated at the PDP.

For that purpose, the PDP is attached to a chassis base having an excellent thermal conductivity, and a heat spreading sheet (or heat conductive seat) is provided between the PDP and the chassis base such that the heat generated at the PDP is dissipated to the outside via the heat conductive seat and the chassis base. The chassis base is typically formed with a metallic material such as aluminum by die casting or pressing. The heat conductive seat is typically formed of acryl or silicon-based resin.

For heat conduction efficiency the installation state of the heat conductive seat becomes very important because the heat conduction efficiency can be heightened only if the heat conductive seat is closely adhered to the PDP and the chassis base.

However, the side of the chassis base contacting the heat conductive seat cannot be completely flattened, but may be slightly curved or protruded due to the processing conditions. Consequently, when the heat conductive seat contacts the non-flattened side of the chassis base, a gap is made between the heat conductive seat and the chassis base, and is filled with air.

When the plasma display device is manufactured such that air is present between the chassis base and the heat conductive seat, the desired heat conduction cannot be made in view of the air so that the overall thermal conduction rate and the heat dissipation efficiency become deteriorated. Such a problem occurs at the contact area between the chassis base and the heat conductive seat as well as at the contact area between the PDP and the heat conductive seat.

In order to solve such a problem, when the heat conductive seat is attached to the PDP or the chassis base, the pressurizing power applied to the heat conductive seat may be increased while enhancing the adhesive strength. However, in this case, an impact is applied to the PDP due to the increased pressurizing power so that the partitioning wall thereof can become damaged and cause device failure.

Japanese Patent Publication Laid-open No. Hei10-254372 discloses a plasma display device where prominence and depression are formed at the contact area between the heat conductive seat and the PDP to remove the gap between them. When the heat conductive seat is pressurized onto the PDP, the prominent portion becomes pressed to the depressed portion while flattening the depressed area and allow the air in the depressed portion to escape to the outside.

However, it is practically difficult to make the side of the PDP or the chassis base contacting the heat conductive seat be completely flattened. Furthermore, when pressurizing power to the heat conductive seat is increased to enhance the adhesion efficiency, the partitioning wall of the PDP may be damaged while causing device failure. Therefore, a need exists for a plasma display device which can enhance efficiency in the adhesion of the heat conductive seat even though the contact side of the heat conductive seat is not completely flattened. The present invention provides a solution to meet such need.

SUMMARY OF THE INVENTION

In accordance with the present invention a plasma display device is provided which can enhance efficiency in the adhesion of the heat conductive seat while not increasing the pressurizing power to the heat conductive seat.

The plasma display device includes a plasma display panel, a chassis base proceeding substantially parallel to the plasma display panel, and a heat conductive medium closely adhered to the plasma display panel and the chassis base while being disposed between the plasma display panel and the chassis base. The side of the heat conductive medium facing the plasma display panel and/or chassis base is provided with a plurality of prominent portions. Depressed portions are disposed between the prominent portions to remove the gap between the heat conductive medium and the respective plasma display panel and/or chassis base. Contact area enlargement members are formed at the prominent portions to improve the attachment efficiency of the heat conductive medium to the respective plasma display panel and/or chassis base.

The prominent portions of the heat conductive medium are formed as a plurality of longitudinally parallel convex portions. The contact area enlargement member can be formed by three-dimensional pattern separated by a groove. The three-dimensional pattern can be formed as a diamond-like shape, or as a comb teeth shape.

A gel-state heat conductive member can be formed at the depressed portions. The gel-state heat conductive member can be formed with grease.

The plasma display device further includes a reinforcing member formed at the heat conductive medium to reinforce the hardness of the heat conductive medium. The reinforcing member can be formed with micro-fibers or micro-metals built into the heat conductive medium while bearing a predetermined pattern.

A plurality of holes are formed at the prominent portions while passing through the prominent portions. The holes are arranged at grooves of the prominent portions outlining a contact area enlargement member. The holes are formed with a circular shape.

DETAILED DESCRIPTION OF THE INVENTION

Figure 1:
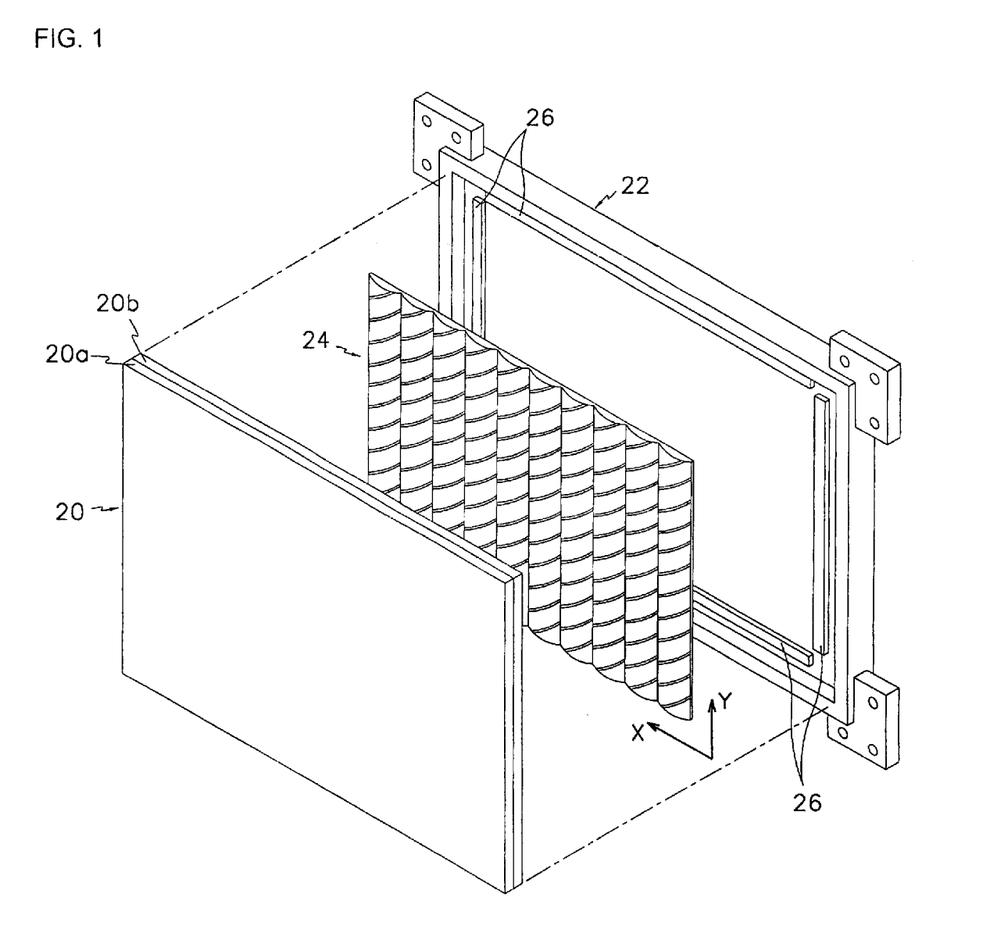
FIG. 1 is an exploded perspective view of a plasma display device according to a first embodiment of the present invention.

FIG. 1 is an exploded perspective view of a plasma display device according to a first embodiment of the present invention.

As shown in FIG. 1, the plasma display device includes PDP 20 with two sheets of glass substrates 20a and 20b, chassis base 22 fitted to PDP 20 while being positioned at the rear side of PDP 20 opposite to the display screen side thereof. Heat conductive medium 24 is disposed between PDP 20 and chassis base 22 to transfer the heat generated at PDP 20 to chassis base 22. A front case (not shown) is provided to the side of PDP 20, and a back case (not shown) is provided to the side of chassis base 22, thereby constructing the plasma display device.

In the above structure, PDP 20 has a rectangular shape with long and short axes. Chassis base 22 is formed from aluminum which has an excellent thermal conductivity. A circuit unit is fitted to a side of chassis base 22 opposite to the side thereof in contact with PDP 20 to drive the plasma display device.

Heat conductive medium 24, together with chassis base 22, have the role of dissipating to the outside the heat generated at PDP 20 due to the operation of the plasma display device. In order to enhance efficiency in the adhesion of heat conductive medium 24 to chassis base 22 or PDP 20, heat conductive medium 24 has a structure with the following features.

Heat conductive medium 24 is formed with a soft material such as silicon-based resin, acryl-based resin and urethane while having a shape corresponding to that of PDP 20 or chassis base 22. A plurality of prominent portions 24a are provided at the side of heat conductive medium 24 contacting either PDP 20.

Prominent portions 24a of heat conductive medium 24 are formed as in a series longitudinally parallel convex portions.

Figure 2:
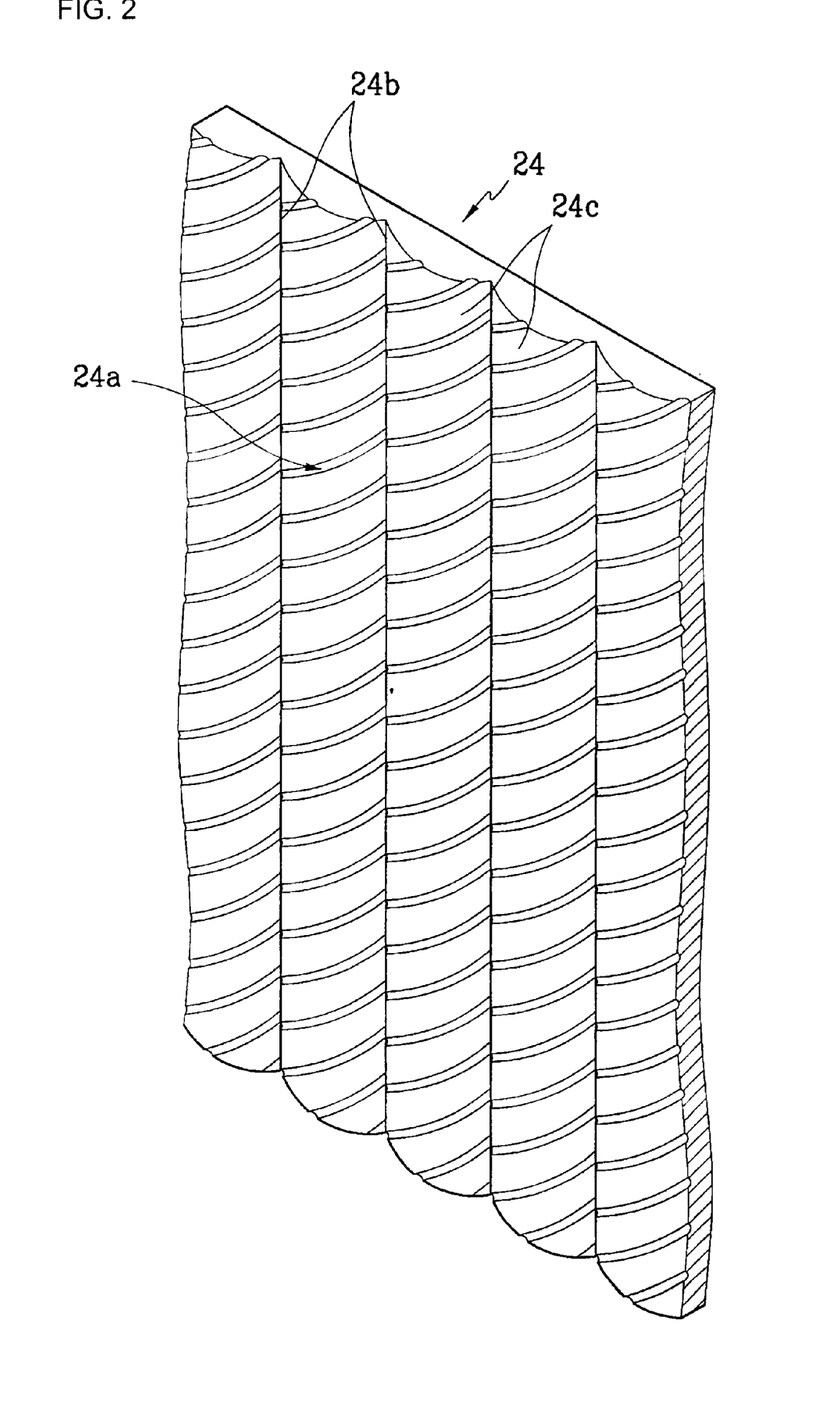
FIG. 2 is a partial amplified view of the plasma display device shown in FIG. 1 illustrating the structure of a heat conductive medium.

As shown in FIG. 2, depressed portions 24b are disposed between prominent portions 24a while having a shape varied depending upon the curvature of prominent portions 24a. Prominent portions 24a are closely adhered to PDP 20.

Figure 3A:
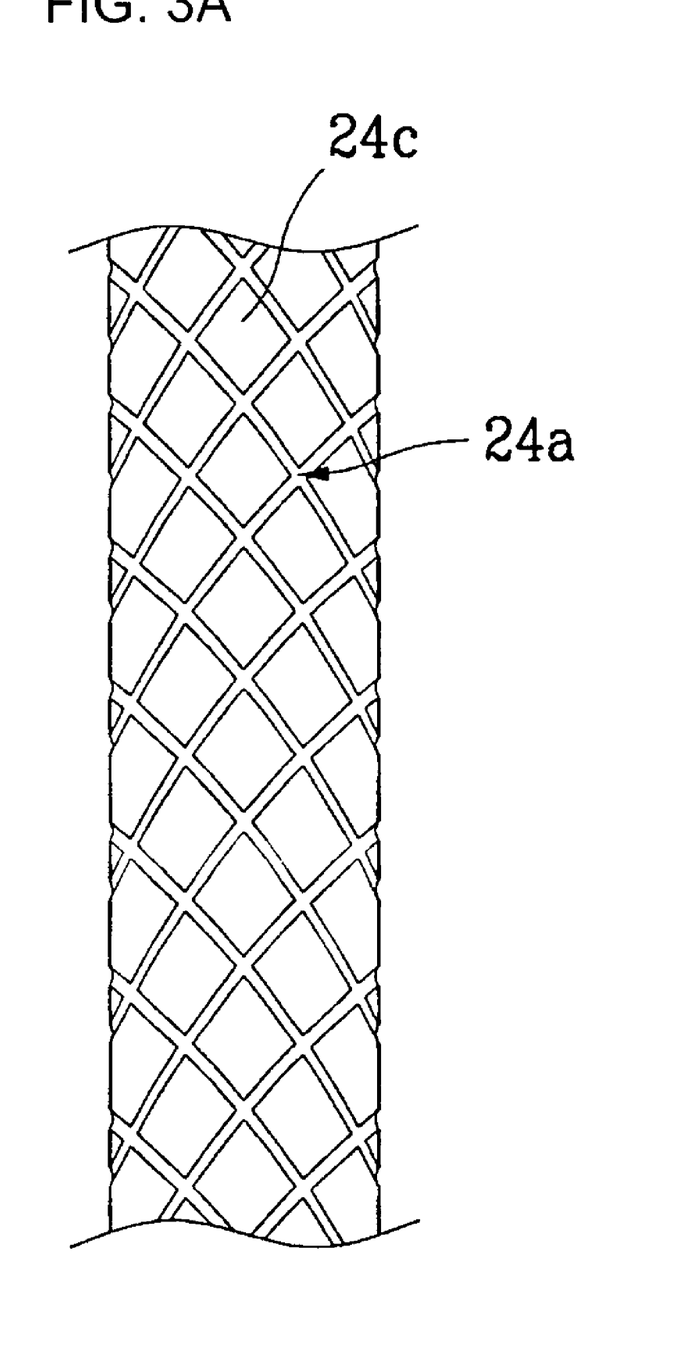
FIGS. 3A and 3B are plan views illustrating a contact area enlargement member of the heat conductive medium shown in FIG. 2.

Furthermore, contact area enlargement members are formed at each prominent portion 24a to enhance the adhesive strength of heat conductive medium 24 to PDP 20. In this embodiment, the contact area enlargement members form a comb teeth pattern 24c, created by periodically spaced grooves along each of the series of longitudinally parallel convex portions as shown in FIG. 2, or by diamond-like patterns as shown in FIG. 3A.

Figure 3B:
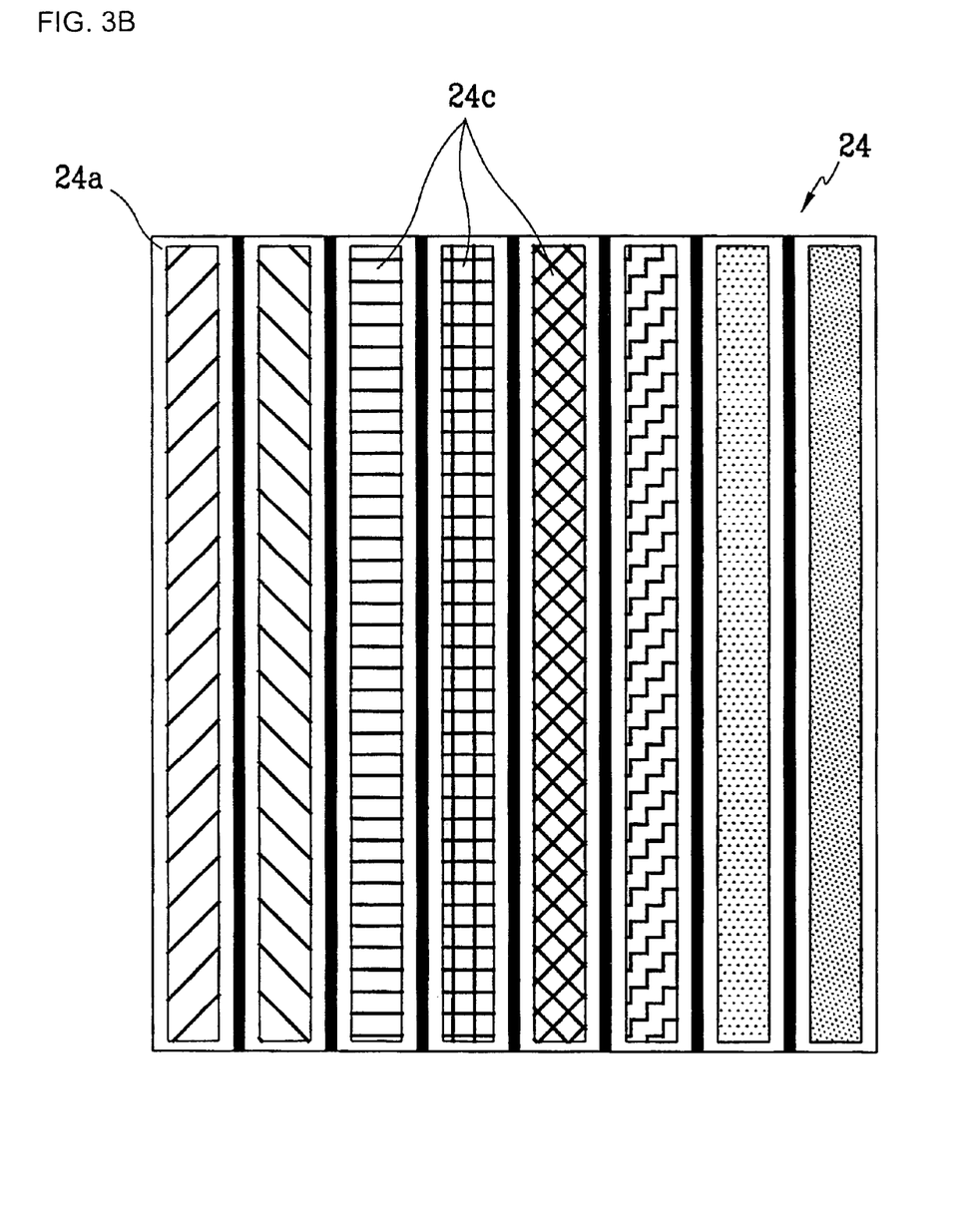

Alternatively, as shown in FIG. 3B, a plurality of different-shaped patterns 24c may be made at respective prominent portions 24a.

The heat conductive medium 24 is installed between PDP 20 and chassis base 22 as follows.

Figure 4A:
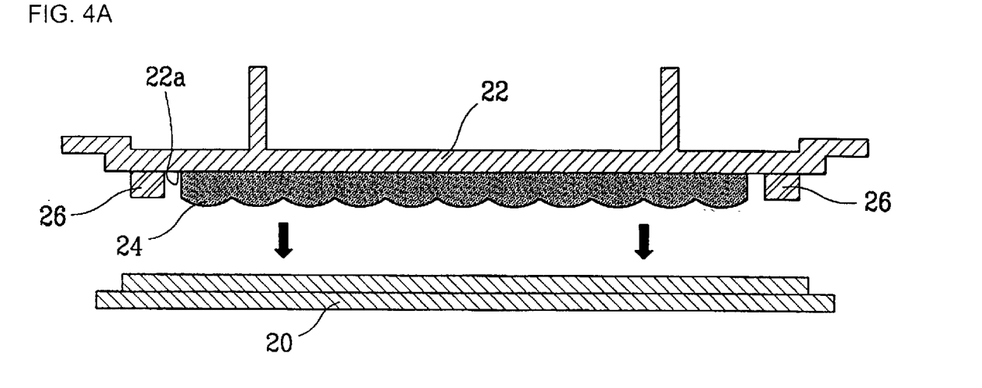
FIGS. 4A to 4C illustrate the steps of combining the structural components of the plasma display device shown in FIG. 1.

As shown in FIG. 4A, heat conductive medium 24 is attached to bottom side 22a of chassis base 22, such that air is not present between heat conductive medium 24 and chassis base 22.

Thereafter, double-faced tape 26 is attached to the bottom side of chassis base 22 around the periphery of heat conductive medium 24.

Figure 4B:
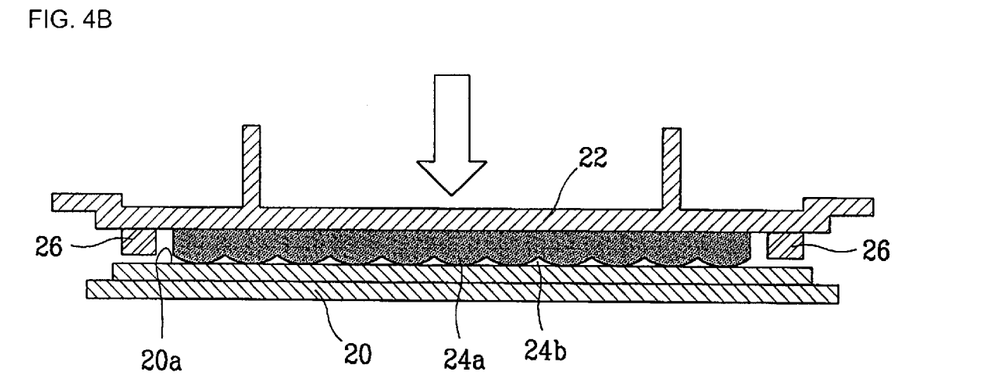

As shown in FIG. 4B, when chassis base 22 is combined with PDP 20 such that prominent portions 24a of heat conductive medium 24 are closely adhered to top side 20a of PDP 20, a predetermined pressurizing power is applied to chassis base 22 from the top. As the side of heat conductive medium 24 with prominent portions 24a is increased in the contact area by way of patterns 24c, it can be more easily attached to top side 20a of PDP 20.

Figure 4C:
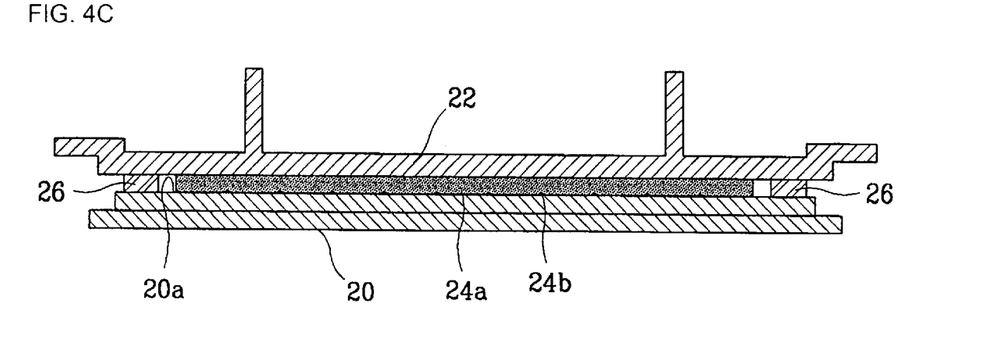

As shown in FIG. 4C, prominent portions 24a are pressed toward depressed portions 24b while being deformed in shape. Consequently, depressed portions 24b are flattened while allowing the air therein to escape to the outside. Double-faced tape 26 engages PDP 20. Accordingly, heat conductive medium 24 can be attached to the top side of PDP 20 without forming any gap between them.

As described above, heat conductive medium 24 is attached to PDP 20 and chassis base 22 while being positioned between them without forming any gap so that the heat conduction rate is enhanced while effectively dissipating the heat generated at PDP 20 to the outside.

Figure 5:
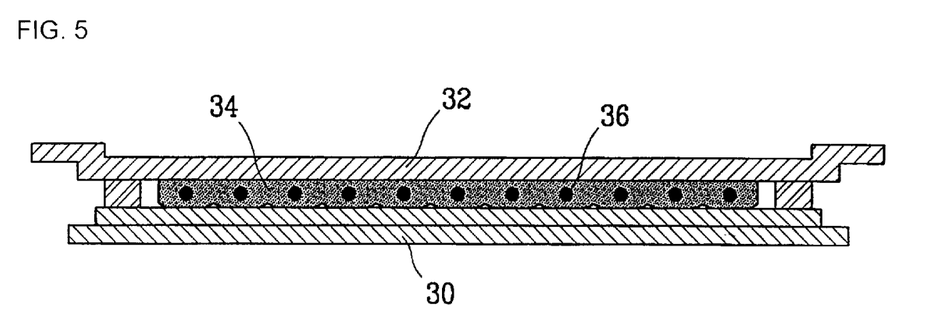
FIG. 5 is a cross sectional view of a plasma display device according to a second embodiment of the present invention.

FIG. 5 is a cross sectional view of a plasma display device according to a second embodiment of the present invention.

As shown in FIG. 5, the plasma display device includes PDP 30, chassis base 32, and heat conductive medium 34 disposed between PDP 30 and chassis base 32. The basic structure of PDP 30, chassis base 32 and heat conductive medium 34 is the same as that related to the first embodiment except that reinforcing member 36 is provided to reinforce the hardness of heat conductive medium 34.

When heat conductive medium 34 is attached to PDP 30 and chassis base 32, a separator such as vinyl and film is separated from both sides of heat conductive medium 34. At this time, reinforcing member 36 makes it easy to perform the separation while maintaining the original shape of soft material-based heat conductive medium 34 in a stable manner.

That is, conventionally, the heat conductive medium is coated with a separator before the attachment process. When the separator is separated from the soft material-based heat conductive medium, it is difficult to make the separation operation while keeping the original shape of the heat conductive medium in a stable manner. In this case, the heat conductive medium is not easily attached to the panel and the chassis base.

Figure 6A:
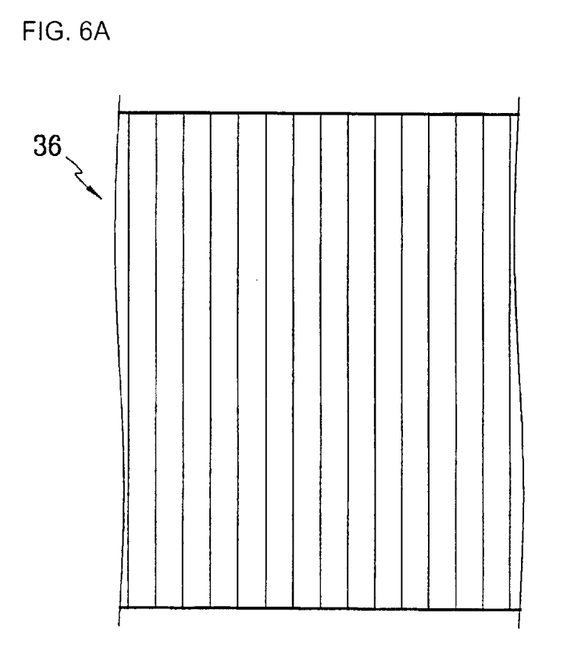
FIGS. 6A and 6B are plan views illustrating a pattern of a reinforcing agent for the plasma display device shown in FIG. 5.
Figure 6B:
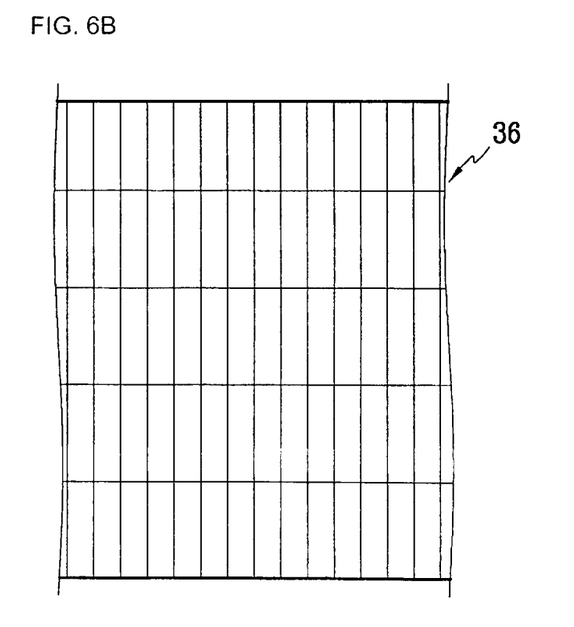

Reinforcing member 36 compensates for such a shortcoming. Reinforcing member 36 may be formed with micro fibers or micro metals built in heat conductive medium 34. The overall pattern of reinforcing member 36 is preferably formed in a parallel shape as shown in FIG. 6A, or a lattice shape as shown in FIG. 6B.

As described above, in this second embodiment, reinforcing member 36 is built in heat conductive medium 34 such that it can form the frame of heat conductive medium 34. In this way, the possible device failure due to the softness of heat conductive medium 34 can be prevented.

Figure 7:
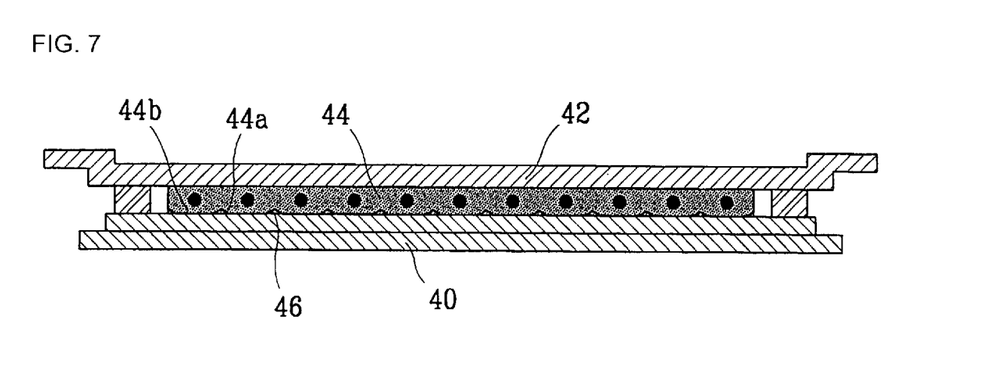
FIG. 7 is a cross sectional view of a plasma display device according to a third embodiment of the present invention.

FIG. 7 is a cross sectional view of a plasma display device according to a third embodiment of the present invention. In this embodiment, when the heat conductive medium is provided between the PDP and the chassis base, the possible gap between the contact sides can be removed.

Specifically, the plasma display device includes PDP 40, chassis base 42, and heat conductive medium 44 disposed between PDP 40 and chassis base 42. Furthermore, liquid phase (such as a gel-state) heat conductive member 46 is provided at depressed portions 44a of heat conductive medium 44. Gel-state heat conductive member 46 helps prevent left over air in depressed portions 44a deteriorating the heat conductive rate of heat conductive medium 44 when heat conductive medium 44 is attached to PDP 40. Heat conductive member 46 is preferably formed with thermal grease. That is, in the presence of heat conductive member 46 provided between depressed portions 44a, when heat conductive medium 44 is attached to PDP 40, heat conductive member 46 occupies the gap between prominent portions 44b of heat conductive medium 44 while allowing the air therein to escape to the outside. Consequently, the heat dissipation efficiency of the resulting display device can be enhanced depending upon the heat conduction degree of heat conductive medium 44 as well as that of heat conductive member 46. The heat conductive member 46 may be selectively provided either at PDP 40 or at heat conductive medium 44 while being positioned at depressed portions 44a.

In order to form the contact area enlargement patterns at the prominent portions of the heat conductive medium, a frame with a shape corresponding to the relevant pattern may be pressed onto the target material for the heat conductive medium, or a separate patterning unit with the relevant pattern may be prepared, and attached to the target material for the heat conductive medium.

Figure 8:
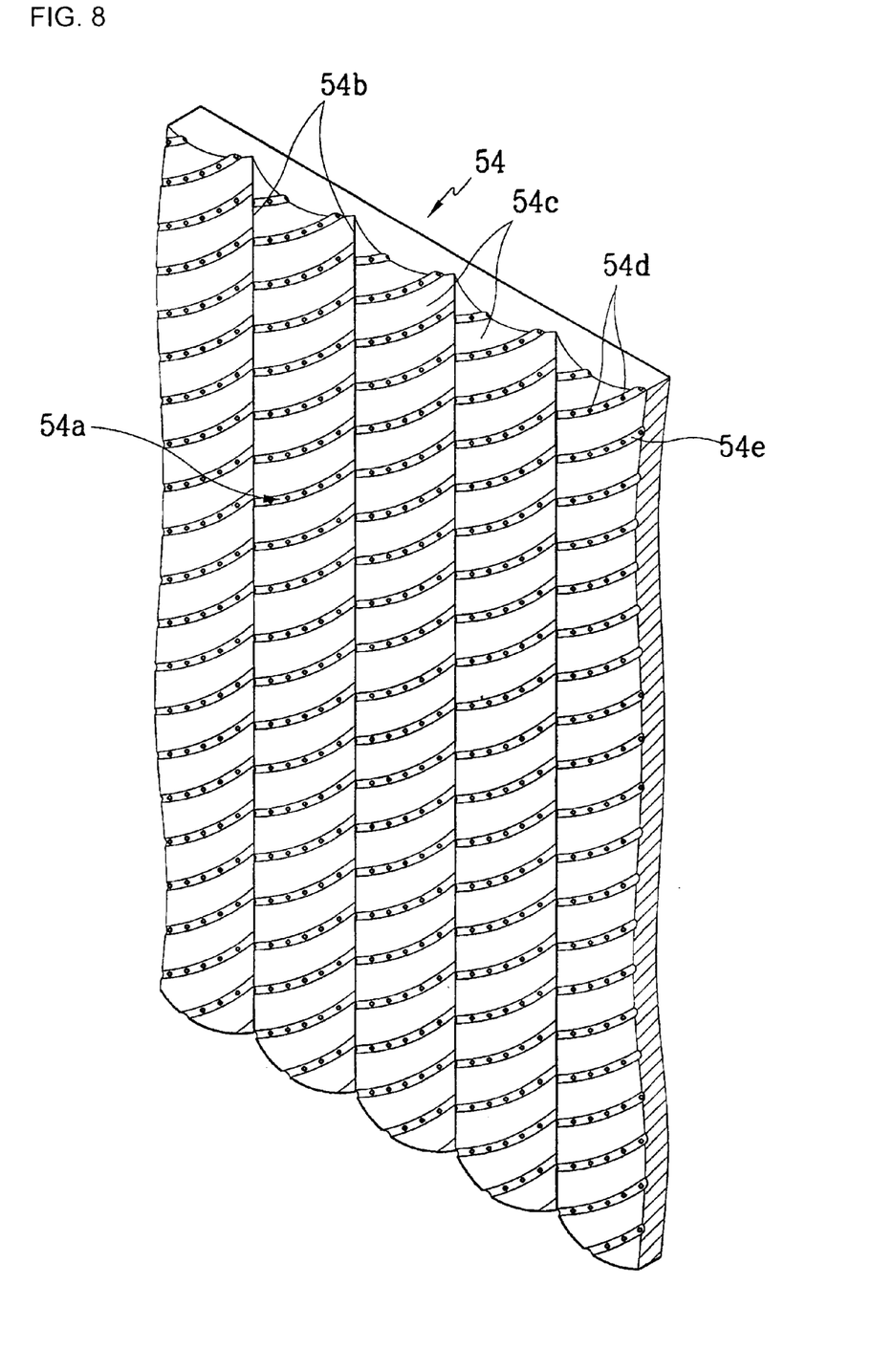
FIG. 8 is a cross sectional view of a heat conductive medium for a plasma display device according to a fourth embodiment of the present invention.

FIG. 8 is a partial perspective view of a heat conductive medium according to a fourth embodiment of the present invention.

As shown in FIG. 8, heat conductive medium 54 has a plurality of prominent portions 54a, and depressed portions 54b disposed between prominent portions 54a. Contact area enlargement members are provided at the surface of prominent portions 54a by a plurality of patterns 54c. Furthermore, a plurality of holes 54d are formed at prominent portions 54a such that they pass through prominent portions 54a.

The holes 54d are arranged at prominent portion 54a while being spaced apart from each other at a predetermined distance. Preferably, holes 54d may be uniformly arranged at the entire surface of heat conductive medium 54 including depressed portions 54b.

In this embodiment, holes 54d are arranged at grooves 54e outlining patterns 54c, holes 54d being of a circular shape.

In this case, the diameter of each hole is established to be about 0.1–2 mm. This is determined in consideration of the pressurizing power applied to heat conductive medium 54 in combination with the chassis base and the PDP. In the presence of such holes, the overall area of the heat conductive medium becomes reduced so that it suffers relatively small pressurizing power during the combination.

Holes 54d may be formed by pressing heat conductive medium 54 using a press with pins corresponding to holes 54d, or through rolling heat conductive medium 54 by way of a roller with the pins.

Figure 9:
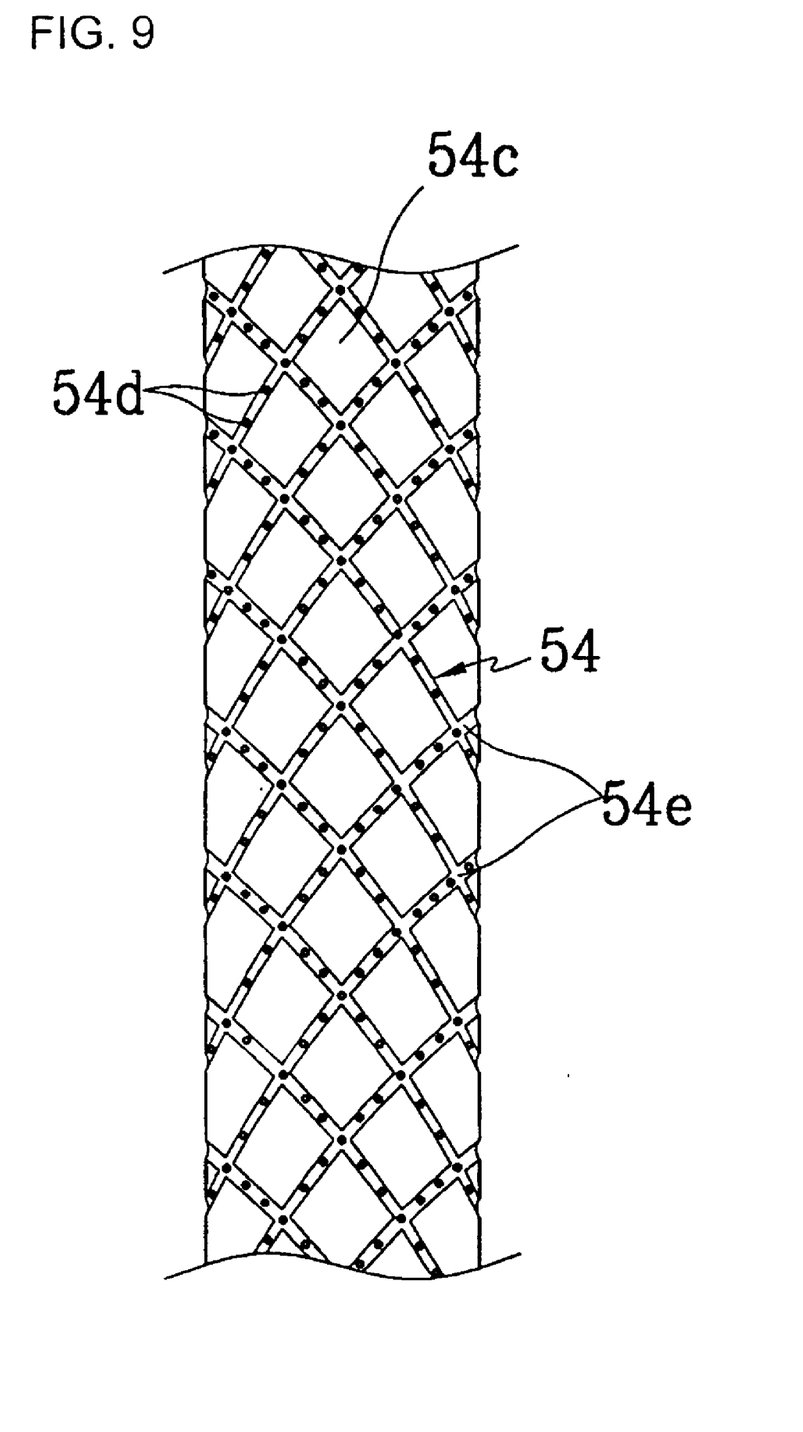
FIG. 9 is a partial plan view illustrating a variation in the heat conductive medium shown in FIG. 8.

FIG. 9 illustrates a variation in heat conductive medium 54 according to the fourth embodiment of the present invention.

The process of forming heat conductive medium 54 between the PDP and the chassis base will be now explained in detail.

Figure 10A:
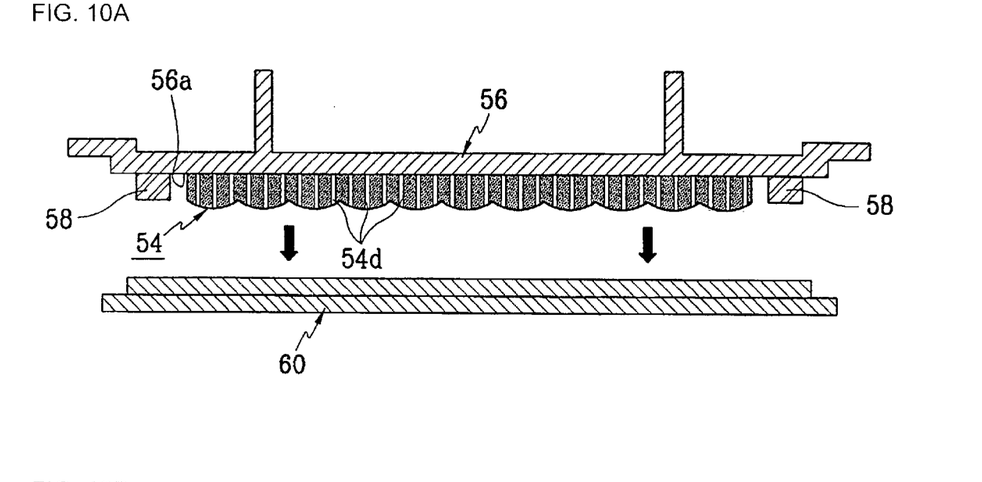
FIGS. 10A to 10C illustrate the steps of combining the structural components of the plasma display device shown in FIG. 8.

As shown in FIG. 10A, heat conductive medium 54 is attached to bottom side 56a of chassis base 56. The attachment may be made by way of a squeeze while not forming a gap between heat conductive medium 54 and chassis base 56.

Figure 10B:
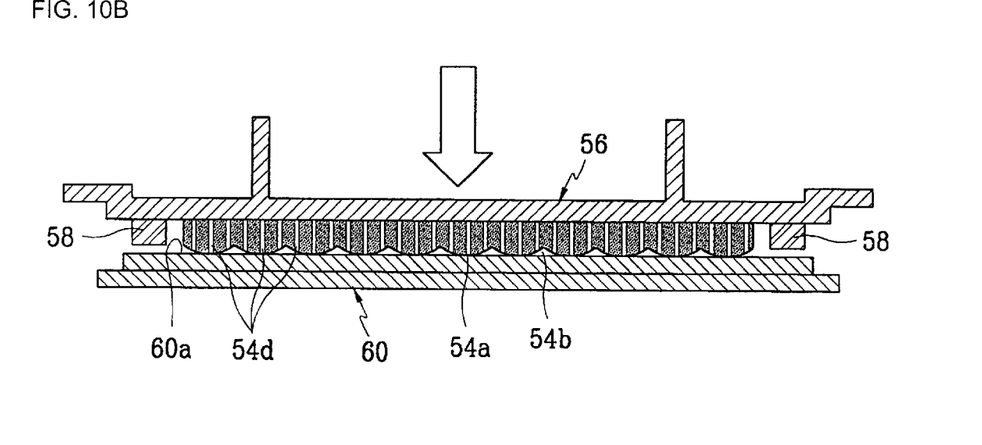

Thereafter, a combination member such as a double-faced tape 58 is provided at the attachment side of chassis base 56. As shown in FIG. 10B, when chassis base 56 is aligned with PDP 60 such that prominent portions 54a of heat conductive medium 54 contact attachment side 60a of PDP 60, a predetermined pressurizing power is applied to chassis base 56 from the top.

The pressurizing power may be reduced due to the presence of holes 54d. When heat conductive medium 54 is pressurized onto attachment side 60a of PDP 60, the pressurizing power spreads onto the entire surface of prominent portions 54a while pressurizing holes 54d.

Accordingly, holes 54d are contracted toward their centers while removing the internal empty space. The air filled in the empty space of holes 54d is extracted to depressed portions 54b through grooves 54e.

Figure 10C:
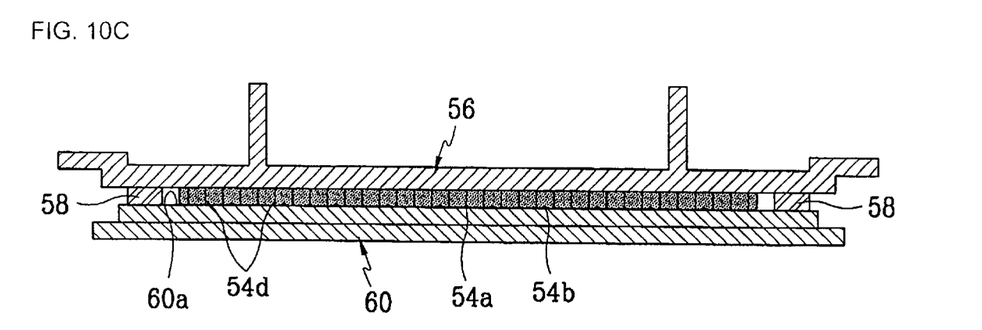

As shown in FIG. 10C, prominent portions 54a are deformed from their original shape while being pressed to the side of depressed portions 54b, and depressed portions 54b are removed by way of prominent portions 54a while allowing the air therein to escape to the outside.

Consequently, heat conductive medium 54 can become attached to the PDP while avoiding any gap between them. That is, the attachment is enhanced by way of holes 54d at heat conductive medium 54.

As described above, in the inventive plasma display device, the attachment of the heat conductive medium to the PDP or the chassis base may be made in an effective manner while enhancing the heat conduction rate of the heat conductive medium and reliability of the resulting product.

Accordingly, a separate heat dissipate member such as a cooling fan is no longer required in the inventive plasma display device so that possible noise due to the cooling fan can be prevented.

Figure 11:
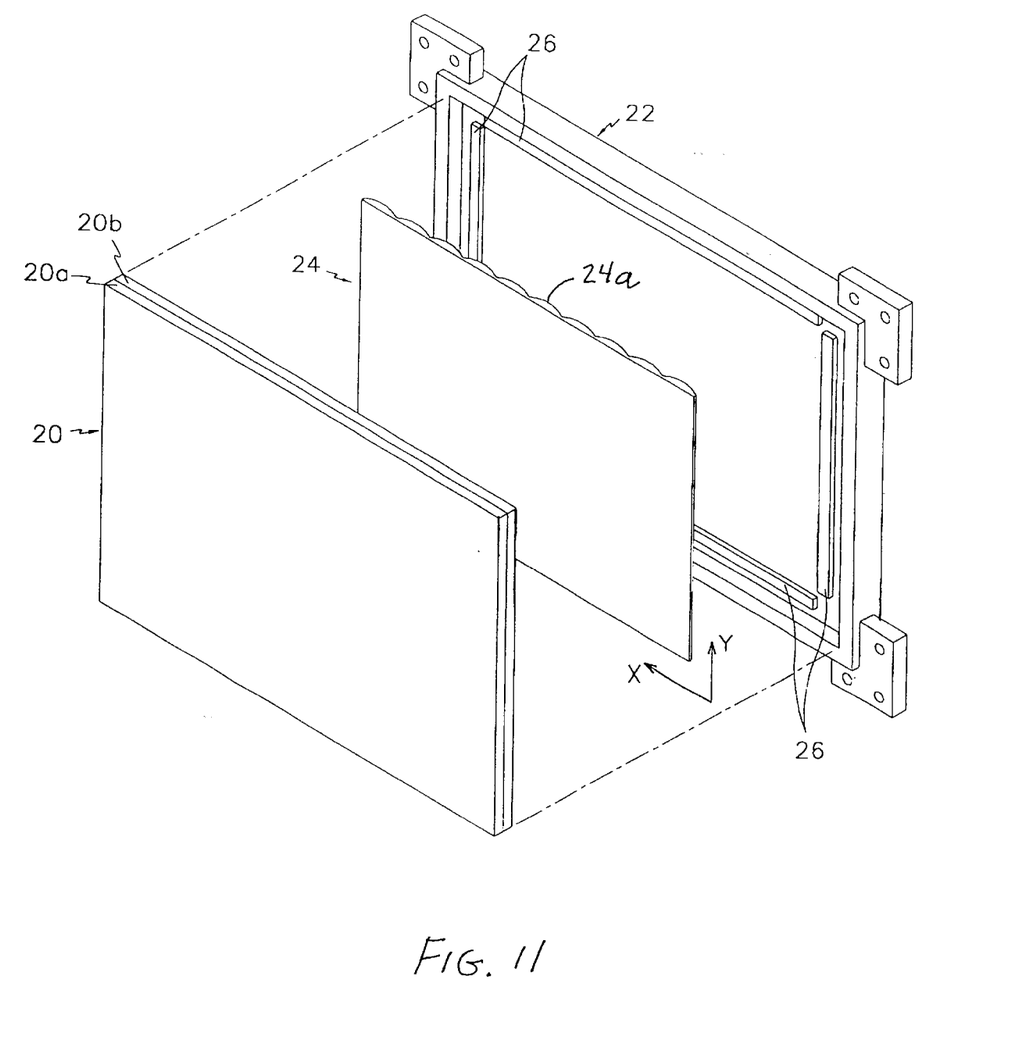
FIG. 11 is an exploded perspective view of a plasma display device according to a further embodiment of the present invention.
Figure 12:
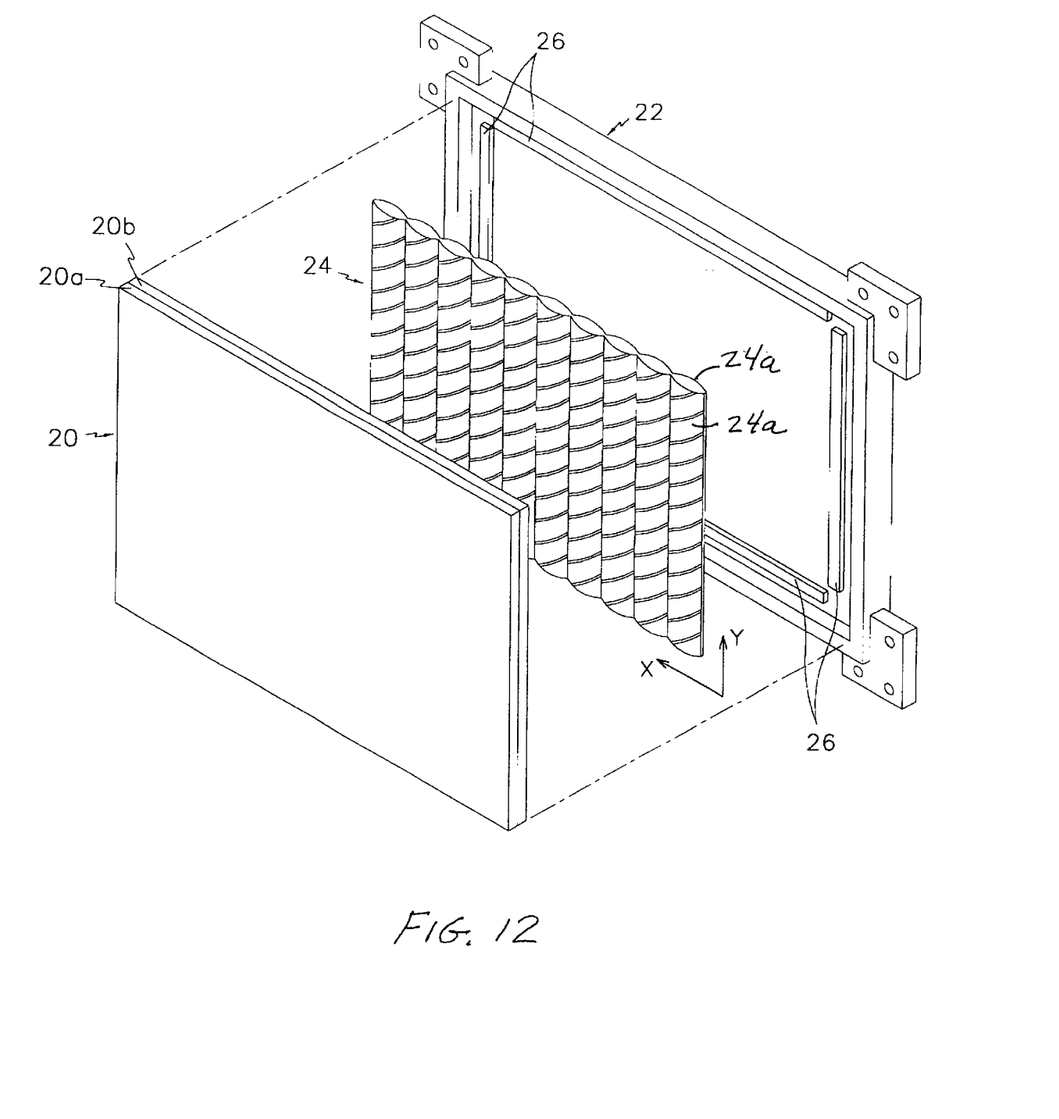
FIG. 12 is an exploded perspective view of a plasma display device according to a still further embodiment of the present invention.

While the present invention has been described in detail with reference to the certain embodiments, those skilled in the art will appreciate that various modifications and substitutions can be made thereto without departing from the spirit and scope of the present invention. For example, referring to FIG. 11, the inventive structural components and its method of manufacture hereinbefore described may be provided on a side of the heat conductive medium such that the chassis base rather than the PDP is in contact with the inventive side of the heat conductive medium having the prominent portions. Similarly, as can be seen in FIG. 12, both sides of the heat conductive medium can implement the inventive structural components such that both the PDP and the chassis base can be in contact with an inventive side of the heat conductive medium having the prominent portions.

What is claimed is:

1. A plasma display device comprising:
   a plasma display panel;
   a chassis base proceeding substantially parallel to the plasma display panel; and
   a heat conductive medium closely adhered to the plasma display panel and the chassis base while being disposed between the plasma display panel and the chassis base;
   wherein a side of the heat conductive medium facing the plasma display panel and/or the chassis base is provided with a plurality of prominent portions, depressed portions being disposed between the prominent portions to remove a gap between the heat conductive medium and the respective plasma display panel and/or chassis base, and contact area enlargement members being formed at the prominent portions to improve the attachment efficiency of the heat conductive medium to the plasma display panel.

2. The plasma display device of claim 1, wherein the prominent portions of the heat conductive medium include a plurality of longitudinally parallel convex portions.

3. The plasma display device of claim 1, wherein a contact area enlargement member is formed by a three-dimensional pattern, each contact area enlargement member being separated from each other by a groove.

4. The plasma display device of claim 3, wherein the three-dimensional pattern is diamond-like shaped.

5. The plasma display device of claim 3, wherein the three-dimensional portion is comb teeth shaped.

6. The plasma display device of claim 1, wherein a gel-state heat conductive member is formed at the depressed portions.

7. The plasma display device of claim 6, wherein the gel-state heat conductive member is formed with grease.

8. The plasma display device of claim 1, further comprising a reinforcing member formed in the heat conductive medium to reinforce the hardness of the heat conductive medium.

9. The plasma display device of claim 8, wherein the reinforcing member is formed by micro fibers built into the heat conductive medium in a predetermined pattern.

10. The plasma display device of claim 8, wherein the reinforcing member is formed by micro metals built into the heat conductive medium in a predetermined pattern.

11. The plasma display device of claim 1, further comprising a plurality of holes passing through the prominent portions.

12. The plasma display device of claim 11, wherein the holes are arranged located along grooves separating the contact area enlargement members of the prominent portions.

13. The plasma display device of claim 11, wherein the holes are of a circular shape.

14. A heat conductive apparatus for a plasma display device having a plasma display panel substantially parallel to a chassis base, the heat conductive apparatus comprising:
    a heat conductive medium installable between the plasma display panel and the chassis base;
    wherein a side of the heat conductive medium facing the plasma display and/or chassis base is provided with a plurality of prominent portions, depressed portions being disposed between the prominent portions to remove a gap between an installed heat conductive medium and the respective plasma display panel and/or chassis base, and contact area enlargement members being formed at the prominent portions to improve the attachment efficiency of the installed heat conductive medium to the respective plasma display panel and/or chassis base.

15. The heat conductive apparatus of claim 14, wherein the prominent portions of the heat conductive medium include a plurality of longitudinally parallel convex portions.

16. The heat conductive apparatus of claim 14, wherein a contact area enlargement member is formed by a three-dimensional pattern, each contact area enlargement member being separated from each other by a groove.

17. The heat conductive apparatus of claim 16, wherein the three-dimensional pattern is diamond-like shaped.

18. The heat conductive apparatus of claim 16, wherein the three-dimensional pattern is comb teeth shaped.

19. The heat conductive apparatus of claim 14 a gel-state heat conductive member is formed at the depressed portions.

20. The heat conductive apparatus of claim 19, wherein the gel-state heat conductive member is formed with grease.

21. The heat conductive apparatus of claim 14, further comprising a reinforcing member formed in the heat conductive medium to reinforce the hardness of the heat conductive medium.

22. The heat conductive apparatus of claim 21, wherein the reinforcing member is formed by micro fibers built into the heat conductive medium in a predetermined pattern.

23. The heat conductive apparatus of claim 21, wherein the reinforcing member is formed by micro metals built into the heat conductive medium in a predetermined pattern.

24. The heat conductive apparatus of claim 14, further comprising a plurality of holes passing through the prominent portions.

25. The heat conductive apparatus of claim 24, wherein the holes are arranged located along grooves separating the contact area enlargement members of the prominent portions.

26. The heat conductive apparatus of claim 24, wherein the holes a circular shape.

* * * * *